(12) United States Patent
Shih et al.

(10) Patent No.: US 10,344,383 B2
(45) Date of Patent: Jul. 9, 2019

(54) SEMICONDUCTOR PACKAGE DEVICE AND METHOD OF MANUFACTURING THE SAME (71) Applicant: Advanced Semiconductor Engineering, Inc., Kaohsiung (TW)

(72) Inventors: Chuan-Yung Shih, Kaohsiung (TW); Tai-Yuan Huang, Kaohsiung (TW); Yu-Chi Wang, Kaohsiung (TW); Chin-Feng Wang, Kaohsiung (TW); Sing-Syuan Shiau, Kaohsiung (TW); Chun-Wei Shih, Kaohsiung (TW); Shao-Ci Huang, Kaohsiung (TW); Huang-Hsien Chang, Kaohsiung (TW); Yuan-Feng Chiang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/668,632

(22) Filed: Aug. 3, 2017

(65) Prior Publication Data
US 2019/0040527 A1    Feb. 7, 2019

(51) Int. Cl.
*H01L 21/02* (2006.01)
*C23C 16/458* (2006.01)
*H01L 21/285* (2006.01)
*H01L 21/677* (2006.01)
*H01L 21/687* (2006.01)

(52) U.S. Cl.
CPC ...... *C23C 16/458* (2013.01); *H01L 21/67742* (2013.01); *H01L 21/68785* (2013.01); *H01L 21/0262* (2013.01); *H01L 21/02271* (2013.01); *H01L 21/28556* (2013.01)

(58) Field of Classification Search
CPC ............ C23C 16/458; H01L 21/68785; H01L 21/02271; H01L 21/0262; H01L 21/67742; H01L 21/28556
See application file for complete search history.

(56) References Cited

U.S. PATENT DOCUMENTS

| 6,307,184 B1 * | 10/2001 | Womack | H01L 21/67109 118/724 |
| 2004/0182515 A1 * | 9/2004 | Sato | C03C 15/00 156/345.43 |
| 2013/0022760 A1 * | 1/2013 | Debari | H01J 37/32192 427/575 |
| 2017/0025254 A1 * | 1/2017 | Tandou et al. | C23C 14/48 438/758 |

* cited by examiner

*Primary Examiner* — Jasmine J Clark
(74) *Attorney, Agent, or Firm* — Foley & Lardner LLP; Cliff Z. Liu (57) ABSTRACT

In one or more embodiments, an apparatus for processing a wafer includes a ceramic wall, a metal wall and a frame. The ceramic wall defines a chamber for accommodating the wafer. The ceramic wall has a first surface defining a first opening. The metal wall surrounds the ceramic wall. The metal wall has a second surface defining a second opening adjacent to the first opening. The frame covers the second surface.

25 Claims, 8 Drawing Sheets

SEMICONDUCTOR PACKAGE DEVICE AND METHOD OF MANUFACTURING THE SAME

BACKGROUND

1. Technical Field

The present disclosure generally relates to a wafer processing device and a method for cleaning the wafer processing device.

2. Description of the Related Art

An apparatus for manufacturing a semiconductor device package, e.g. a Chemical Vapor Deposition (CVD) apparatus, may include an exterior metal casing or wall (e.g. an aluminum (Al) wall) that defines a space to accommodate an interior wall (e.g. an interior ceramic wall) which forms a chamber for processing one or more wafers. The exterior wall (e.g. the aluminum exterior wall) and the interior wall (e.g. the ceramic interior wall) together define an opening through which the wafer may be moved in or out of the chamber. During a CVD process, reactant gases (e.g. nitride gas) can create compositions which deposit upon interior surfaces of the chamber. As these deposits build up, residues can flake off and contaminate future processing steps. For example, deposition products can form on an interior surface of the ceramic wall, an interior surface of the aluminum wall which faces the exterior surface of the ceramic wall (e.g. in a gap between the aluminum wall and the ceramic wall) and also on a surface of the aluminum wall that defines the opening. Such deposition products may bond weakly to the aluminum wall and may be readily peeled off from the aluminum wall. The peeled-off deposition products may drop or fall onto a wafer when transferring the wafer, thereby contaminating the wafer.

SUMMARY

In one or more embodiments, an apparatus for processing a wafer includes a ceramic wall, a metal wall and a frame. The ceramic wall defines a chamber for accommodating the wafer. The ceramic wall has a first surface defining a first opening. The metal wall surrounds the ceramic wall. The metal wall has a second surface defining a second opening adjacent to the first opening. The frame covers the second surface.

In one or more embodiments, an apparatus for processing a wafer includes a wall and a frame. The wall defines a chamber for accommodating the wafer and has a first surface defining an opening for transferring the wafer. The frame is conformally formed on the first surface.

In one or more embodiments, a method for processing a wafer includes providing a processing apparatus that includes a chamber surrounded by a wall, the wall defining an opening. The method further includes transferring the wafer into the chamber through the opening; and applying a CVD film on the wafer. At least a portion of a surface of the wall that defines the opening is covered by a frame.

BRIEF DESCRIPTION OF THE DRAWINGS

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
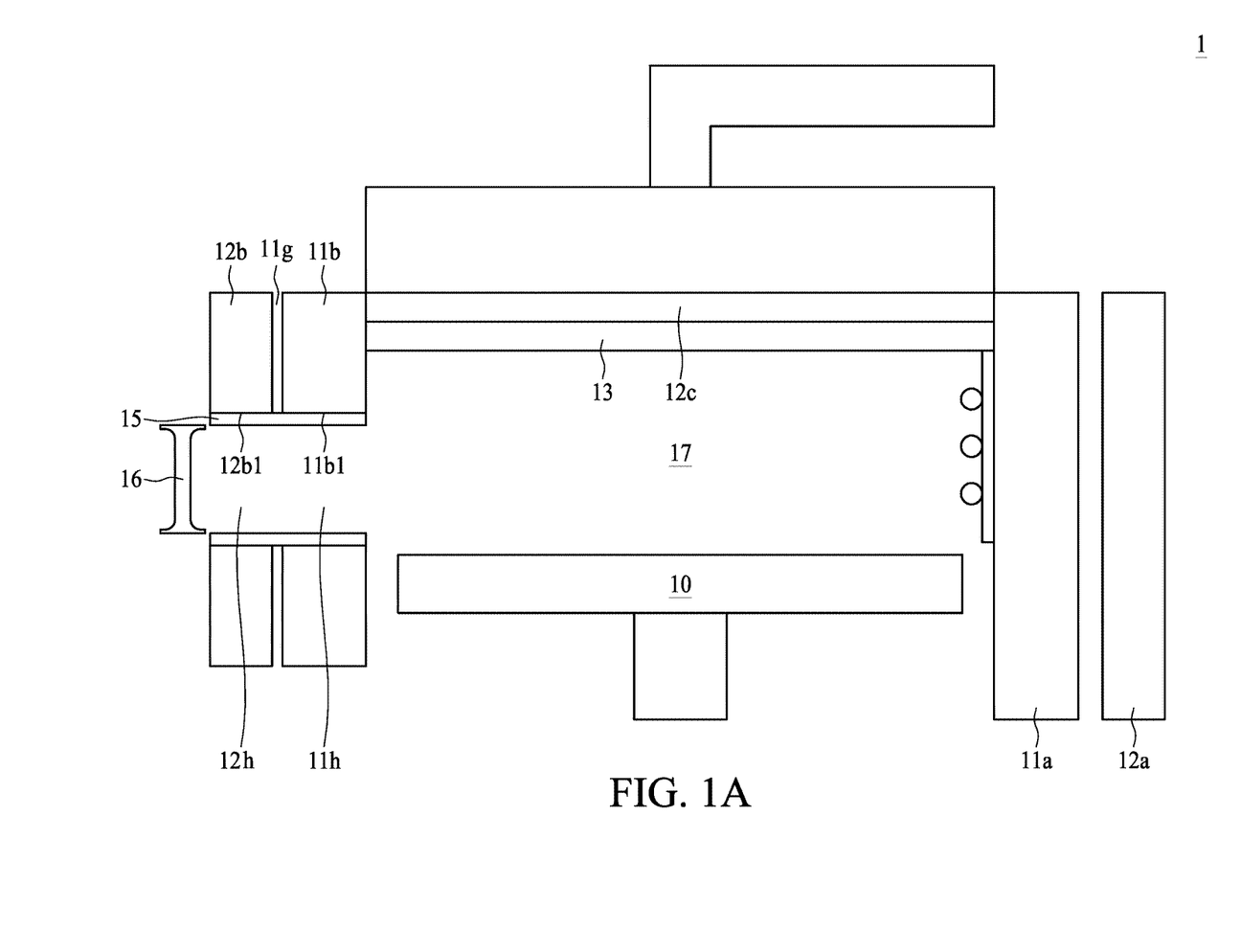
FIG. 1A illustrates a cross-sectional view of some embodiments of a wafer processing device in accordance with a first aspect of the present disclosure.

FIG. 1A illustrates a cross-sectional view of some embodiments of a wafer processing device 1 in accordance with a first aspect of the present disclosure. The wafer processing device 1 includes a susceptor 10, a showerhead 13, a frame 15, a door 16 and a chamber 17.

The susceptor 10 can support or hold a wafer (e.g. on an upper surface of the susceptor 10). The susceptor 10 is highly thermally responsive and can be mounted on a support structure (e.g. a support finger) so that the susceptor 10 (and the wafer supported on the upper surface of the susceptor 10) can be controllably moved between a lower loading or off-loading position and an upper processing position.

The chamber 17 can accommodate the wafer. The chamber 17 has an exterior wall and an interior wall. In some embodiments, the exterior wall is formed of materials that include, for example, a metal (e.g., aluminum), and the interior wall is formed of materials that include, for example, a ceramic. The exterior wall includes a first portion 12a, a second portion 12b and a third portion 12c. The first portion 12a and the second portion 12b of the exterior wall surround the susceptor 10. The third portion 12c of the exterior wall is substantially perpendicular to the first portion 12a of the exterior wall and to the second portion 12b of the exterior wall. The interior wall includes a first portion 11a and the second portion 11b surrounded or covered by, or respectively adjacent to the first portion 12a of the exterior wall and the second portion 12b of the exterior wall. In some embodiments, the exterior wall and the interior wall can correspond to an outer portion and an inner portion of a combined wall defining the chamber 17.

The second portion 11b of the interior wall defines a first opening 11h and the second portion 12b of the exterior surface defines a second opening 12h. The first opening 11h is adjacent to the second opening 12h and is configured to allow a wafer to pass through. In some embodiments, the first opening 11h is conformal to and aligned with the second opening 12h. In some embodiments, dimensions of the first opening 11h are substantially the same as dimensions of the second opening 12h. The second portion 11b of the interior wall has a first surface 11b1 facing toward the first opening 11h. The first surface 11b1 circumferentially surrounds the first opening 11h to define a periphery of the first opening 11h. The second portion 12b of the exterior wall has a first surface 12b1 facing toward the second opening 12h. The first surface 12b1 circumferentially surrounds the second opening 12h to define a periphery of the second opening 12h. In some embodiments, the first surface 11b1 of the second portion 11b of the interior wall is substantially coplanar with the first surface 12b1 of the second portion 12b of the exterior wall.

Figure 1B:
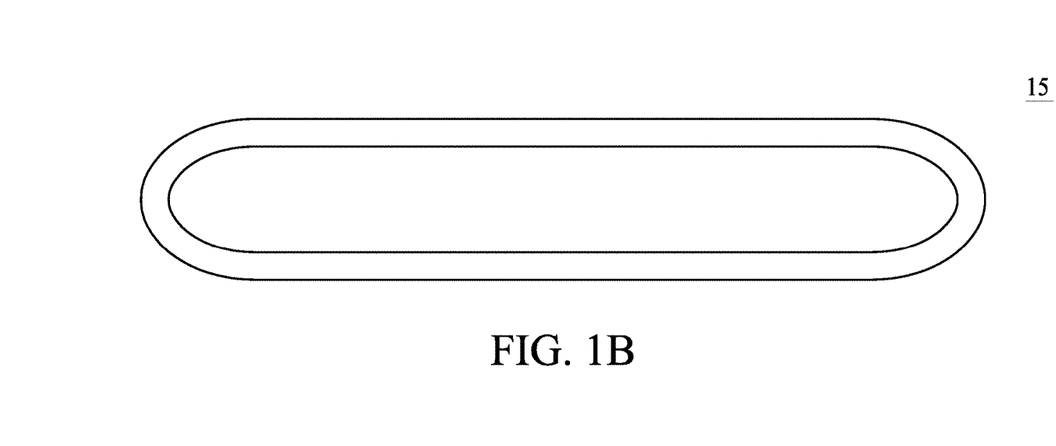
FIG. 1B illustrates a cross-sectional view of a frame in accordance with some embodiments of the present disclosure.
Figure 1C:
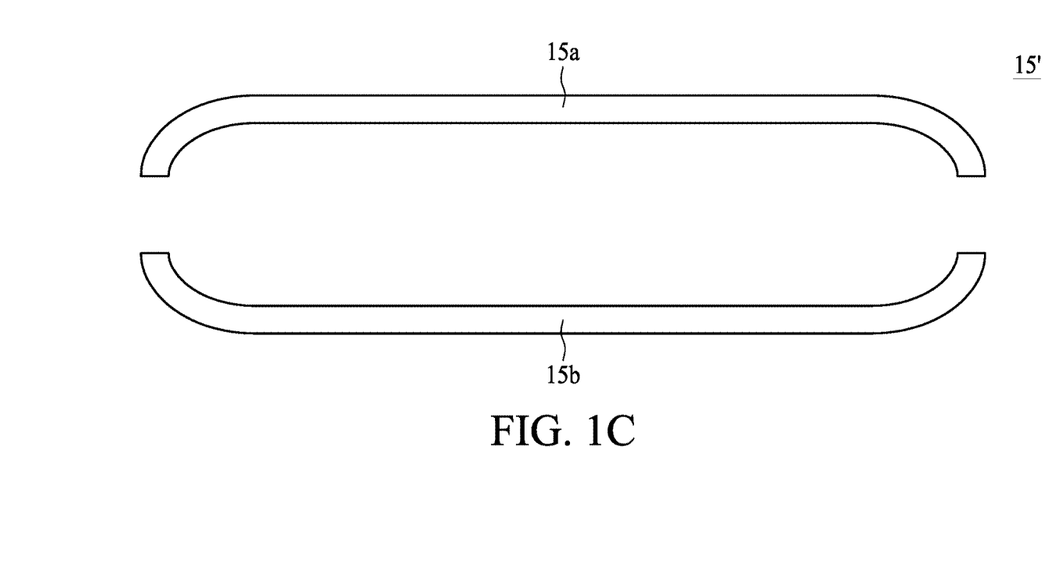
FIG. 1C illustrates a cross-sectional view of a frame in accordance with some embodiments of the present disclosure.
Figure 1D:
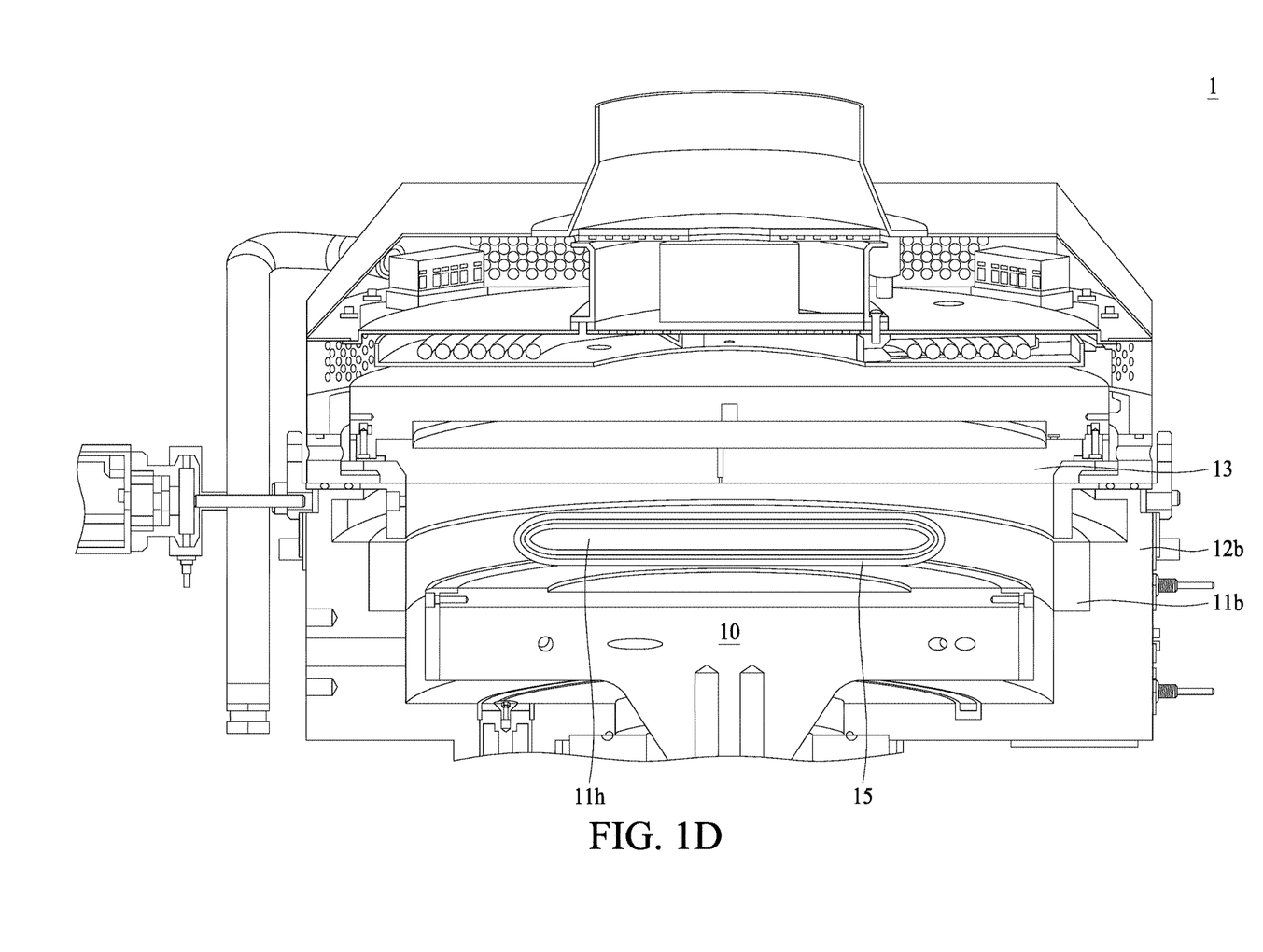
FIG. 1D illustrates a cross-sectional view of a perspective view of some embodiments of a wafer processing device in accordance with the first aspect of the present disclosure.

The frame 15 is disposed on the first surface 11b1 of the second portion 11b of the interior wall and on the first surface 12b1 of the second portion 12b of the exterior wall. In some embodiments, the frame 15 is formed of materials that include, for example, a ceramic such as aluminum oxide ($Al_2O_3$) or another metal or non-metal oxide or a metal or non-metal nitride. In some embodiments, a surface roughness of the frame 15 is in a range from about 1 micrometer (μm) to about 3 μm, such as in terms of root-mean-square surface roughness. In some embodiments, the surface roughness of the frame 15 is greater than a surface roughness of the first surface 12b1 of the exterior wall. In some embodiments, a thickness of the frame 15 is in a range from about 2 millimeter (mm) to about 3.36 mm, or in a range of about 1 mm or greater and up to about 5 mm or greater. In some embodiments, the frame 15 is formed integrally as a single monolithic structure as shown in FIG. 1B. Alternatively, the frame 15' includes at least two pieces as shown in FIG. 1C. For example, the frame 15' may include a first piece 15a and a second piece 15b that can be combined to form the frame. As shown in FIG. 1D, which illustrates a perspective view of some embodiments of the wafer processing device 1, the frame 15 is engaged with (e.g. is in contact with or is adjacent to) sidewalls of the first opening 11h and of the second opening 12h. For example, the frame 15 is substantially conformal to the first opening 11h and to the second opening 12h.

As shown in FIG. 1A, the door 16 is adjacent to the second opening 12h. The door 16 is movable and can be closed to cover or block the opening 12h, or can be opened to expose the opening 12h. In some embodiments, a portion (e.g. a portion adjacent to the door 16) of the first surface 12b1 of the second portion 12b of the exterior wall is not covered by the frame 15 (e.g. is exposed from the frame 15), such that the door 16 can be moved smoothly without being hindered by the frame 15.

The showerhead 13 is disposed on the third portion 12c of the exterior wall. The showerhead 13 is configured to provide gas or plasma to clean the chamber 17 after an operation for processing the wafer in the chamber 17 is terminated. For example, after a CVD deposition process, a remaining CVD film may be disposed on the interior surface of the interior wall, on the sidewalls of the first opening 11h and of the second opening 12h (e.g., on the first surfaces 11b1, 12b1) and in a gap 11g between the second portion 11b of the interior wall and the second portion 12b of the exterior wall. The gas or plasma provided by the showerhead 13 can remove a portion of the remaining CVD film. In some embodiments, a surface roughness of the showerhead 13 is less than about 1 μm (e.g. is in a range from about 0.3 μm to about 0.7 μm) which can help to prevent issues of film dropping or flaking off. In some embodiments, the showerhead 13 includes an aluminum alloy, so that the showerhead 13 has a firm structure that helps to prevent deformation of the showerhead 13.

However, in some implementations a portion of the remaining CVD film might not be removed by the gas or plasma provided by the showerhead 13, which might cause damage to the wafer, as shown in FIG. 2A, FIG. 2B, FIG. 2C and FIG. 2D, which illustrate a comparative CVD process for a wafer.

Figure 2A:
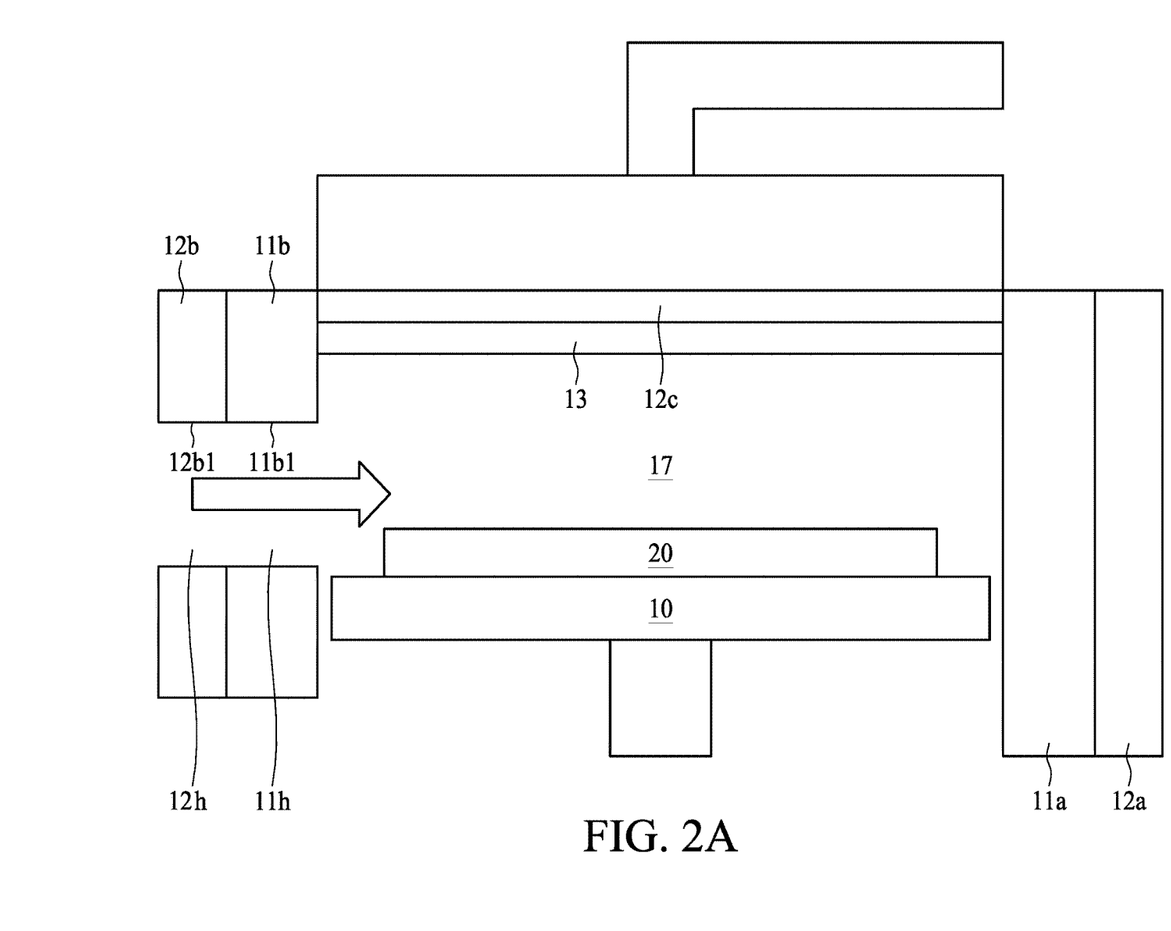
FIG. 2A, FIG. 2B, FIG. 2C and FIG. 2D illustrate a CVD process implemented with a comparative wafer processing device.

Referring to FIG. 2A, a wafer 20 to be processed is transferred into the chamber 17 through the openings 11h, 12h and is disposed on the susceptor 10.

Figure 2B:
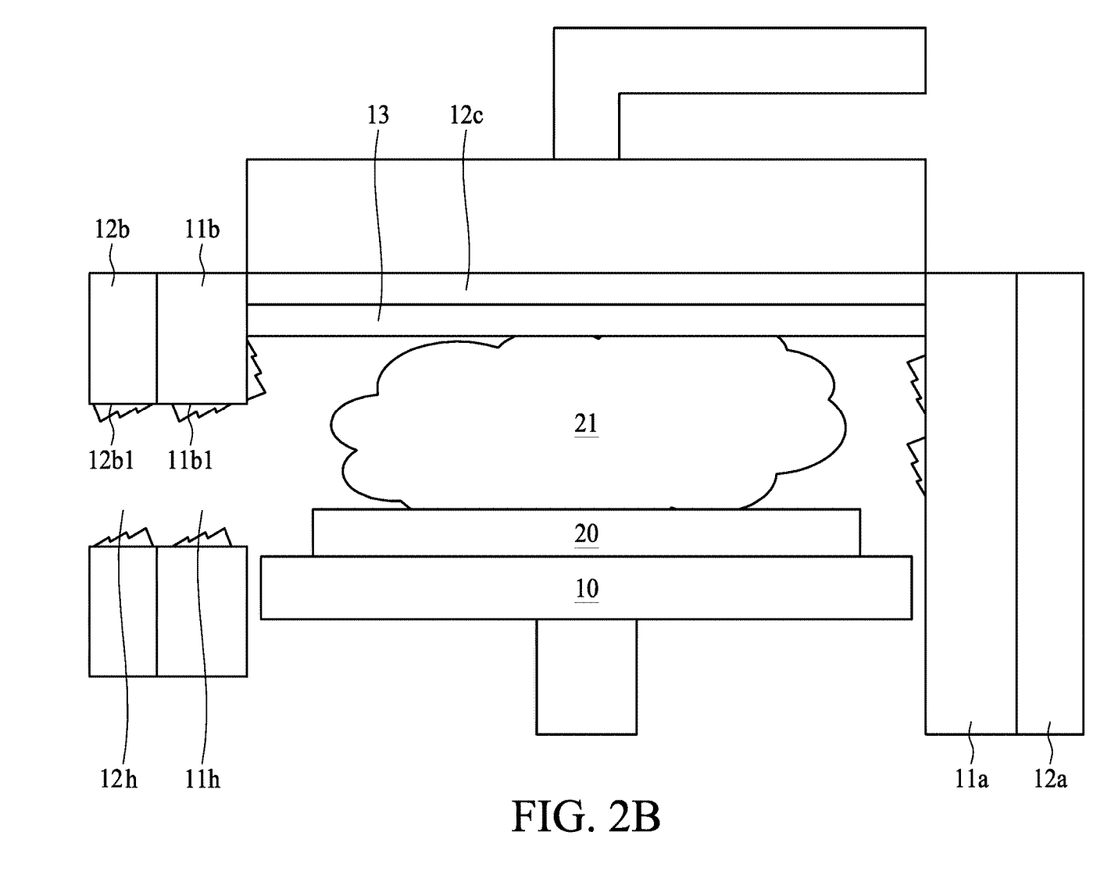

Referring to FIG. 2B, the CVD process is carried out for the wafer 20 to form a passivation layer on the wafer 20. In some embodiments, the CVD process is carried out by supplying a gas 21 or plasma into the chamber 17.

Figure 2C:
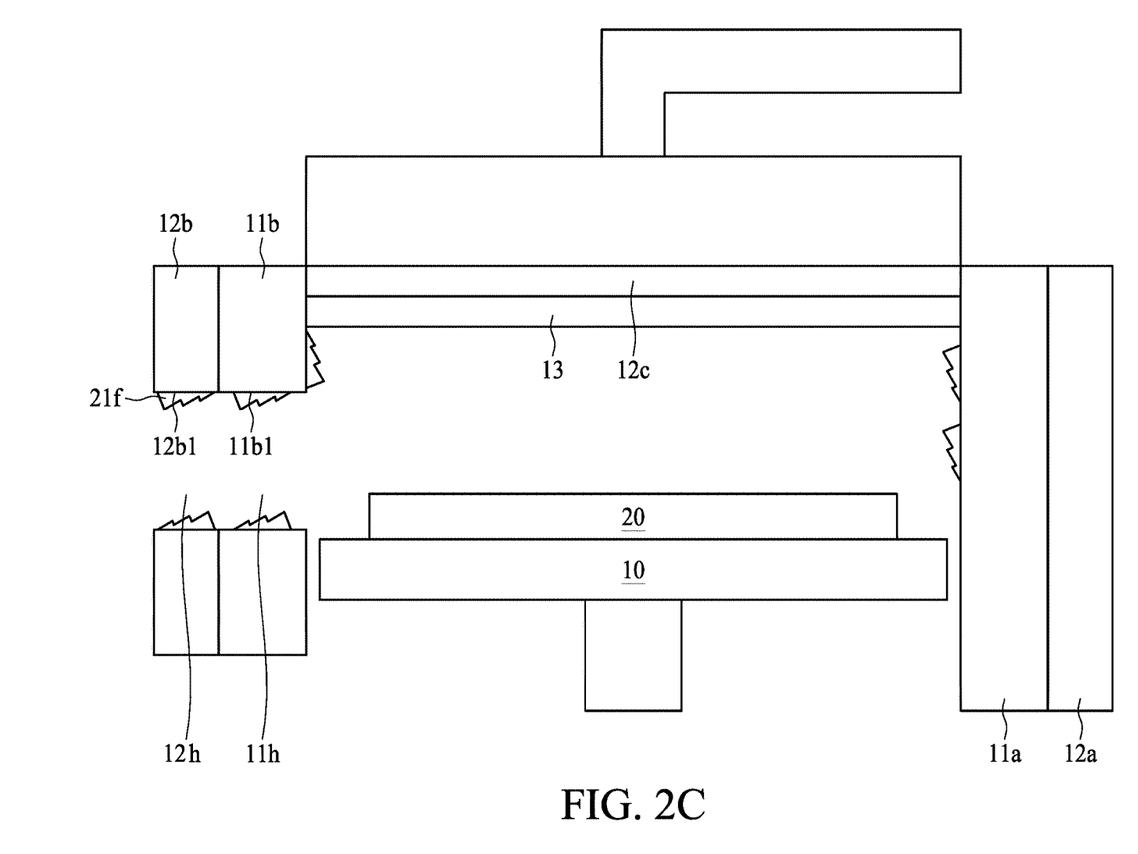

Referring FIG. 2C, after the CVD process, the showerhead 13 is configured to supply gas (e.g., nitrogen gas) into the chamber 17 to remove CVD residue. A portion of the CVD residue (e.g., CVD film 21f) is disposed on the first surface 12b1 of the second portion 12b of the exterior wall and on the surfaces of the interior wall.

Figure 2D:
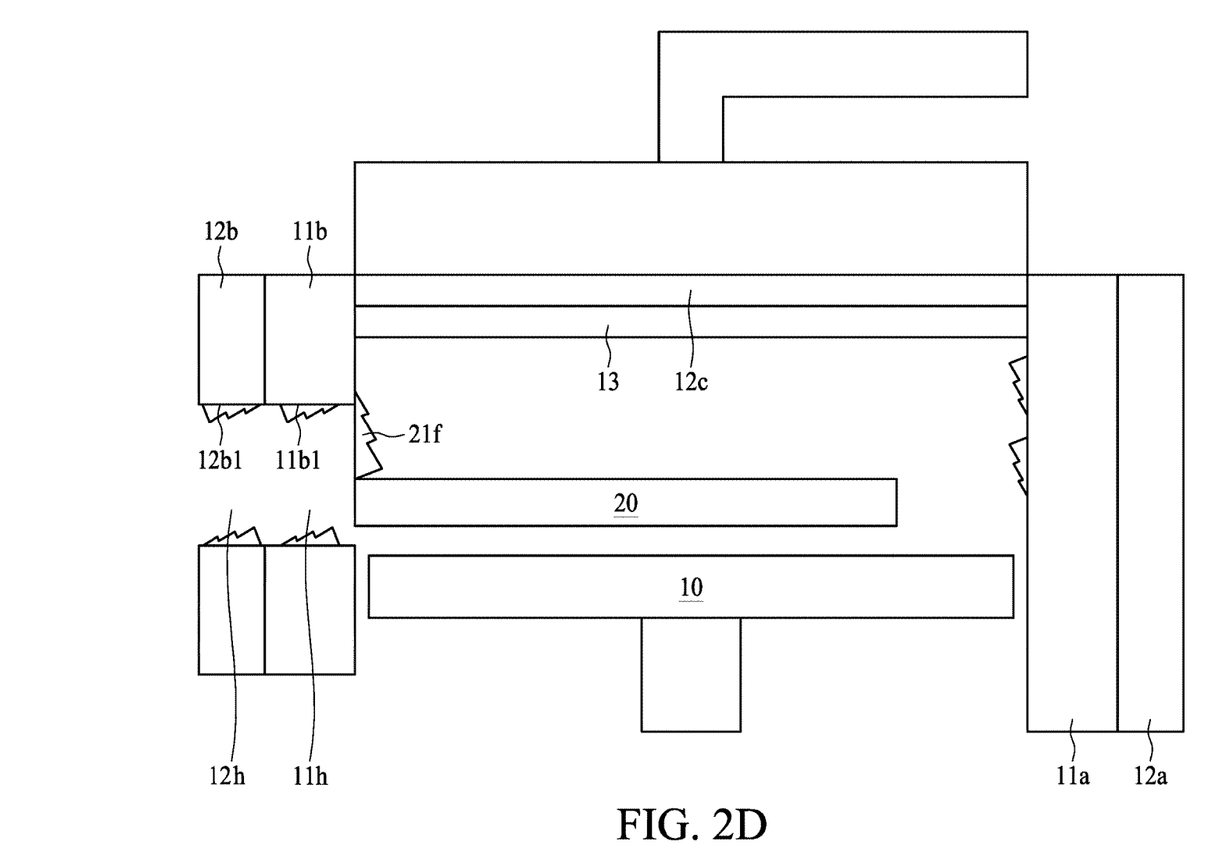

Referring to FIG. 2D, since the CVD film 21f may bond weakly to the exterior wall (e.g. an aluminum exterior wall) and may be readily peeled off from the exterior wall, the peeled-off CVD film 21f may drop or fall onto the wafer 20 when transferring the wafer 20 out of the chamber 17, which could contaminate or damage the wafer 20.

In accordance with some embodiments of the present disclosure, the method shown in FIG. 2A, FIG. 2B, FIG. 2C, and FIG. 2D can be implemented with the embodiments shown in FIG. 1A. By using the frame 15 having a roughness greater than that of surfaces of some comparative wafer processing devices to cover the first surface 12b1 of the second portion 12b of the exterior wall, the CVD film bonds more strongly to the frame 15 than would otherwise be the case, which can help to prevent the CVD film from flaking or falling off of the exterior wall. The frame 15 can help prevent the wafer being damaged and can reduce a yield loss when processing wafers. In addition, since the CVD film is formed on the frame 15 rather than on the first surface 12b1 of the exterior wall (e.g. an aluminum exterior wall), the CVD film can be readily cleaned from the frame 15. Therefore, a time for cleaning the chamber 17 by using gas (e.g., nitrogen gas) can be reduced, which can help to reduce the manufacturing cost.

Figure 3:
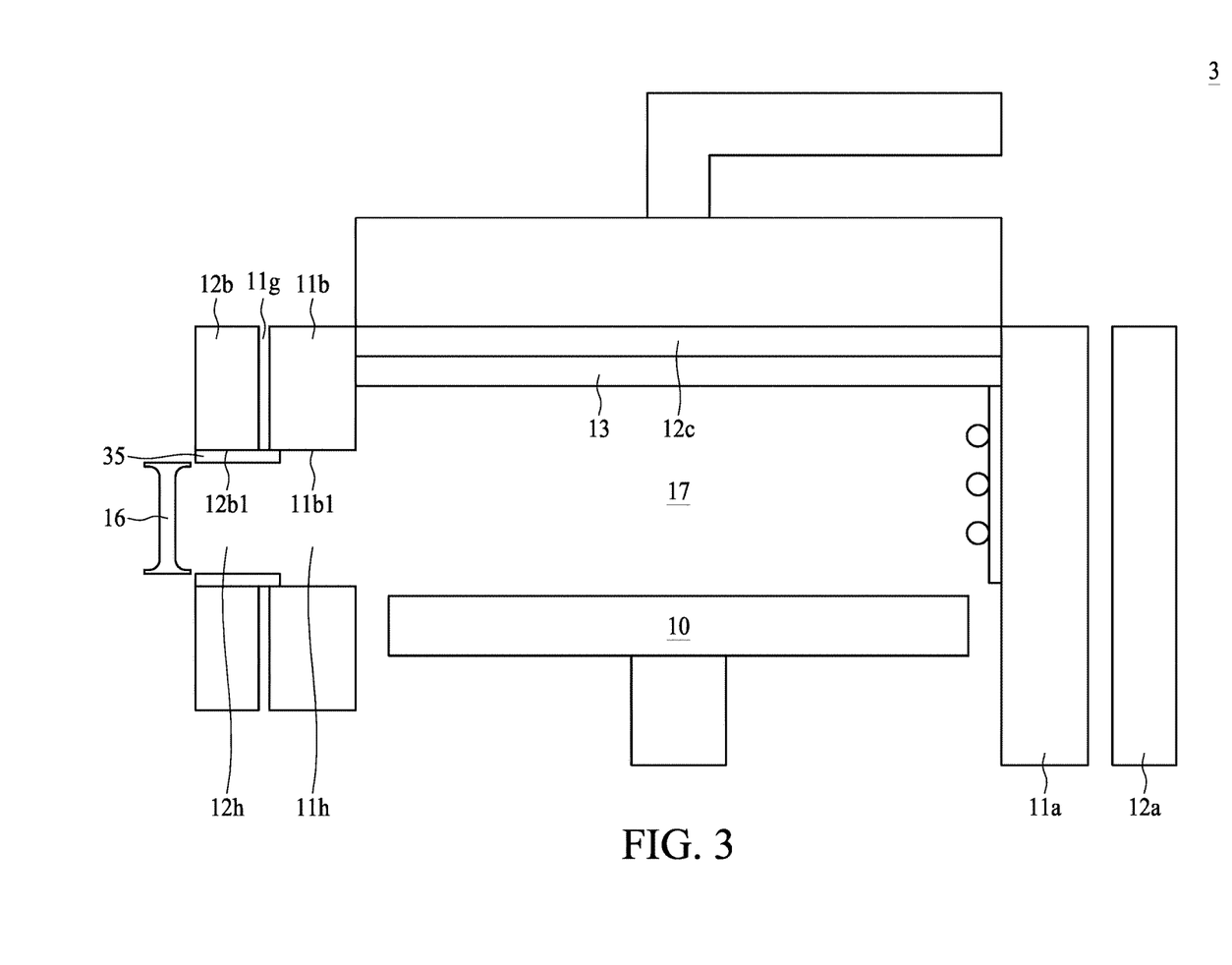
FIG. 3 illustrates a cross-sectional view of some embodiments of a wafer processing device in accordance with a second aspect of the present disclosure.

FIG. 3 illustrates a cross-sectional view of some embodiments of a wafer processing device 3 in accordance with a second aspect of the present disclosure. The wafer processing device 3 is similar to the wafer processing device 1 shown in FIG. 1A, except that in the wafer processing device 3, a frame 35 is disposed on the first surface 12b1 of the second portion 12b of the exterior wall and covers a gap 11g between the second portion 11b of the interior wall and the second portion 12b of the exterior wall, and, for example, leaves at least a portion of the first surface 11b1 of the second portion 11b exposed. In some embodiments, the frame 35 covers a portion of the first surface 11b1 of the second portion 11b. In other embodiments, the frame 35 covers the entire first surface 11b1 of the second portion 11b.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An apparatus for processing a wafer, the apparatus comprising:
    a ceramic wall defining a chamber for accommodating the wafer, the ceramic wall having a first surface defining a first opening; and
    a metal wall surrounding the ceramic wall, the metal wall having a second surface defining a second opening adjacent to the first opening; and
    a frame covering the second surface.
2. The apparatus of claim 1, wherein the frame covers a portion of the first surface.
3. The apparatus of claim 1, wherein the frame covers the entire first surface.
4. The apparatus of claim 1, wherein the frame covers a gap between the ceramic wall and the metal wall.
5. The apparatus of claim 1, wherein a roughness of the frame is in a range from about 1 micrometer (µm) to about 3 µm.
6. The apparatus of claim 1, wherein the frame comprises a ceramic.
7. The apparatus of claim 1, wherein a thickness of the frame is in a range from about 2 millimeters (mm) to about 3.36 mm.
8. The apparatus of claim 1, wherein the frame is formed integrally.
9. The apparatus of claim 1, wherein the frame comprises at least two pieces.
10. The apparatus of claim 1, wherein the metal wall comprises aluminum.
11. The apparatus of claim 1, further comprising a door adjacent to the second opening, wherein a portion of the second surface that is adjacent to the door is not covered by the frame.
12. The apparatus of claim 1, further comprising a susceptor to support the wafer.
13. An apparatus for processing a wafer, the apparatus comprising:
    a wall defining a chamber for accommodating the wafer and having a first surface defining an opening for transferring the wafer; and
    a frame conformally formed on the first surface.
14. The apparatus of claim 13, wherein the wall comprises an inner portion formed of a ceramic and an outer portion formed of a metal.
15. The apparatus of claim 13, wherein a roughness of the frame is in a range from about 1 µm to about 3 µm.
16. The apparatus of claim 13, wherein the frame comprises a ceramic.
17. The apparatus of claim 13, wherein a thickness of the frame is in a range from about 2 mm to about 3.36 mm.
18. The apparatus of claim 13, wherein the frame is formed integrally.
19. The apparatus of claim 13, wherein the frame comprises at least two pieces.
20. A method for processing a wafer, the method comprising:
    (a) providing a processing apparatus, the apparatus including a chamber surrounded by a wall that defines an opening, wherein at least a portion of a surface of the wall that defines the opening is covered by a frame;
    (b) transferring the wafer into the chamber through the opening; and
    (c) applying a chemical vapor deposition (CVD) film on the wafer.
21. The method of claim 20, further comprising transferring the wafer out of the chamber through the opening, wherein a CVD residue is adhered to the frame.
22. The method of claim 20, further comprising removing a CVD residue on the wall of the chamber by a process that includes supplying nitrogen into the chamber.
23. The method of claim 20, wherein a roughness of the frame is in a range from about 1 µm to about 3 µm.
24. The method of claim 20, wherein the frame comprises a ceramic.
25. The method of claim 20, wherein a thickness of the frame is in a range from about 2 mm to about 3.36 mm.

* * * * *